(12) United States Patent
Harris et al.

(10) Patent No.: US 8,310,275 B2
(45) Date of Patent: Nov. 13, 2012

(54) HIGH VOLTAGE TOLERANT INPUT/OUTPUT INTERFACE CIRCUIT

(75) Inventors: Edward B. Harris, Fogelsville, PA (US); Che Choi Leung, Bethlehem Township, Northampton County, PA (US)

(73) Assignee: Agere Systems Inc., Allentown, PA (US)

( * ) Notice: Subject to any disclaimer, the term of this patent is extended or adjusted under 35 U.S.C. 154(b) by 383 days.

(21) Appl. No.: 12/439,389

(22) PCT Filed: Mar. 27, 2008

(86) PCT No.: PCT/US2008/058452
§ 371 (c)(1),
(2), (4) Date: Feb. 27, 2009

(87) PCT Pub. No.: WO2009/120200
PCT Pub. Date: Oct. 1, 2009

(65) Prior Publication Data
US 2011/0043249 A1    Feb. 24, 2011

(51) Int. Cl.
*H03K 19/094*    (2006.01)
(52) U.S. Cl. .......................... 326/84; 326/85
(58) Field of Classification Search ............ 326/84–85, 326/110
See application file for complete search history.

(56) References Cited

U.S. PATENT DOCUMENTS

| | | | | |
|---|---|---|---|---|
| 3,636,372 A | * | 1/1972 | Hujita et al. ................. | 327/433 |
| 3,872,390 A | * | 3/1975 | Nash ............................ | 330/264 |
| 4,301,383 A | * | 11/1981 | Taylor .......................... | 327/437 |
| 4,558,234 A | * | 12/1985 | Suzuki et al. ................ | 326/110 |
| 4,649,295 A | * | 3/1987 | McLaughlin et al. ........ | 326/110 |
| 4,661,723 A | * | 4/1987 | Masuda et al. ............... | 326/110 |
| 4,694,203 A | * | 9/1987 | Uragami et al. .............. | 326/110 |
| 4,730,132 A | * | 3/1988 | Watanabe et al. ............ | 326/110 |
| 4,882,534 A | * | 11/1989 | Koshizuka .................... | 326/84 |
| 4,916,085 A | | 4/1990 | Frisina | |
| 5,150,187 A | | 9/1992 | Huang | |
| 5,184,087 A | | 2/1993 | Kim | |

(Continued)

FOREIGN PATENT DOCUMENTS

EP    0196616    10/1986

(Continued)

OTHER PUBLICATIONS

T. Shimada et al., "A Wide Range 1.0V-3.6V 200 Mbps, Push-Pull Output Buffer Using Parasitic Bipolar Transistors," IEEE, 2003 Symposium on VLSI Circuits Digest of Technical Papers, Jun. 2003, pp. 243-246.

*Primary Examiner* — Jason M Crawford
(74) *Attorney, Agent, or Firm* — Ryan, Mason & Lewis, LLP

(57) ABSTRACT

An IO interface circuit for use in a high voltage tolerant application is provided. The IO interface circuit includes a signal pad and at least a first parasitic bipolar transistor having an emitter adapted for connection to a voltage return of the interface circuit, a base adapted to receive a first control signal, and a collector connected directly to the signal pad in an open collector configuration. The interface circuit further includes a MOS control circuit coupled to the parasitic bipolar transistor and being operative to generate the first control signal. The IO interface circuit may further include an active pull-up circuit connected between a voltage supply of the interface circuit and the signal pad.

25 Claims, 3 Drawing Sheets

U.S. PATENT DOCUMENTS

| | | | |
|---|---|---|---|
| 5,332,933 A * | 7/1994 | Raje | 326/110 |
| 5,570,044 A * | 10/1996 | Martin et al. | 326/84 |
| 5,723,988 A | 3/1998 | Mahant-Shetti et al. | |
| 5,777,510 A | 7/1998 | Lien | |
| 6,388,475 B1 | 5/2002 | Clark et al. | |
| 7,102,167 B1 | 9/2006 | Husher | |
| 2003/0112033 A1 * | 6/2003 | Sams | 326/56 |
| 2004/0124908 A1 * | 7/2004 | Lei | 327/538 |
| 2007/0091530 A1 | 4/2007 | Chen | |
| 2011/0043249 A1 * | 2/2011 | Harris et al. | 326/81 |

FOREIGN PATENT DOCUMENTS

| | | |
|---|---|---|
| EP | 0305937 | 3/1989 |
| EP | 0307323 | 3/1989 |
| WO | PCT/US2008/058452 | 9/2008 |

\* cited by examiner

100

OPEN COLLECTOR
200

300

ACTIVE PULL-UP
400

HIGH VOLTAGE TOLERANT INPUT/OUTPUT INTERFACE CIRCUIT

FIELD OF THE INVENTION

The present invention relates generally to the electrical and electronic arts, and more particularly relates to input/output (IO) interface circuitry.

BACKGROUND OF THE INVENTION

The use of IO interface circuits, such as, for example, IO buffers, is well-known. In advanced complementary metal-oxide-semiconductor (CMOS) integrated circuit (IC) process technology, there has been a push toward lower voltage IO buffers. In a 40 nanometer (nm) IC fabrication process, for example, 1.8-volt transistors are being readily adopted. However, despite the push to utilize lower voltage transistors, there is still a need for high voltage tolerance in certain IO applications that may require interfacing with higher voltages (e.g., 5 volts). One such application is a light emitting diode (LED) driver circuit.

Conventional high voltage tolerant IO interface circuits typically employ stacked metal-oxide-semiconductor (MOS) devices. An example of this configuration is described in U.S. Pat. No. 6,388,475 to Clark et al. While this circuit configuration may help alleviate overvoltage stress on individual devices by distributing the voltage across two or more devices, some high voltage tolerant failsafe specifications require that the circuit tolerate a prescribed voltage even when power to the circuit is removed. This creates a problem for the stacked MOS device approach. Additionally, utilizing stacked MOS devices requires more area in the IC compared to a non-stacked device arrangement and is therefore undesirable.

Another known approach to forming a high voltage tolerant output stage is to employ thick oxide MOS devices. One disadvantage of this approach, however, is that it requires additional IC fabrication steps which increase overall cost.

Accordingly, there exists a need for a high voltage tolerant IO interface circuit which does not suffer from one or more of the above-described problems associated with conventional IO interface circuitry.

SUMMARY OF THE INVENTION

Illustrative embodiments of the invention meet the above-noted need by providing an IO interface circuit having improved tolerance to high voltage signals. Techniques of the present invention beneficially eliminate the need for stacked MOS devices by utilizing one or more parasitic bipolar transistors which have a higher voltage tolerance compared to MOS devices. Moreover, techniques of the invention provide such improved high voltage tolerance using standard CMOS processing technology, and therefore do not add any significant cost compared to conventional IO interface circuitry.

In accordance with one aspect of the invention, an IO interface circuit for use in a high voltage tolerant application is provided. The IO interface circuit includes a signal pad and at least a first parasitic bipolar transistor having an emitter connecting to a voltage return of the interface circuit, a base adapted to receive a first control signal, and a collector connected directly to the signal pad in an open collector configuration. The interface circuit further includes a MOS control circuit coupled to the parasitic bipolar transistor and being operative to generate the first control signal.

In accordance with another aspect of the invention, an IO interface circuit for use in a high voltage tolerant application includes a signal pad and at least a first parasitic bipolar transistor including an emitter connecting to a first voltage source, a base adapted to receive a first control signal, and a collector connected directly to the signal pad. The interface circuit further includes an active pull-up circuit connected between a second voltage source and the signal pad. The active pull-up circuit is adapted to receive a second control signal, the second control signal being a logical complement of the first control signal. A MOS control circuit is coupled to the first parasitic bipolar transistor and being operative to generate the first and second control signals.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary IO interface circuits. It is to be understood, however, that the present invention is not limited to the circuits shown and described herein. Rather, embodiments of the invention may be implemented in any application that can benefit from an interface circuit having increased tolerance to high voltage. Although preferred embodiments of the invention may be fabricated in a silicon wafer, embodiments of the invention can alternatively be fabricated in wafers comprising other materials, including but not limited to Gallium Arsenide (GaAs), Indium Phosphide (InP), etc.

Figure 1:
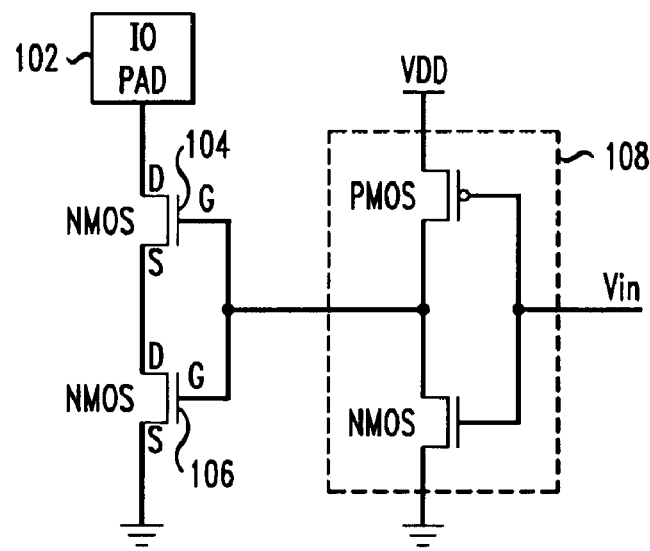
FIG. 1 is a schematic diagram illustrating at least a portion of a conventional output stage for use in a high voltage tolerant application.

FIG. 1 is a schematic diagram illustrating at least a portion of a conventional IO interface circuit 100 for use in a high voltage tolerant application. Interface circuit 100 includes an IO pad 102 and an output stage connected to the IO pad, the output stage comprising a pair of stacked n-channel MOS (NMOS) transistor devices. Specifically, a first NMOS device 104 and a second NMOS device 106 are configured such that a drain (D) of NMOS device 104 is connected to IO pad 102, a source (S) of NMOS device 104 is connected to a drain of NMOS device 106, a source of NMOS device 106 is connected to ground, and gates (G) of NMOS devices 104 and 106 are connected to a CMOS control circuit 108. Control circuit 108 is operative to generate a control signal for selectively activating NMOS devices 104 and 106 as a function of an input signal, Vin, supplied to the control circuit. As shown, control circuit 108 may include an inverter configured in a standard fashion.

While the stacked MOS device approach utilized by interface circuit 100 may help alleviate overvoltage stress on individual NMOS devices 104 and 106 connected to IO pad 102 by distributing a voltage applied to the IO pad across both devices, some high voltage tolerant failsafe specifications require that the circuit tolerate a prescribed voltage even when power to the circuit is removed. This creates a problem for the stacked MOS device approach. Additionally, utilizing stacked MOS devices requires more area in the IC compared to a non-stacked device arrangement and is therefore undesirable.

Figure 2:
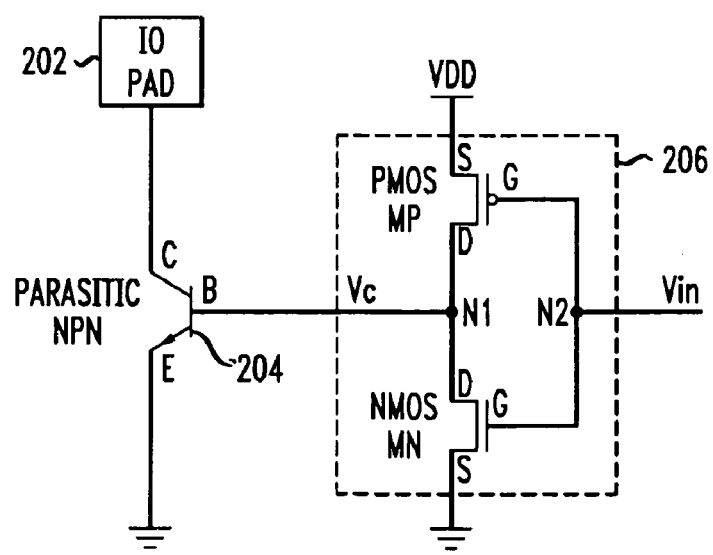
FIG. 2 is a schematic diagram depicting at least a portion of an exemplary IO interface circuit for use in a high voltage tolerant application, in accordance with an embodiment of the present invention.

FIG. 2 is a schematic diagram depicting at least a portion of an exemplary IO interface circuit 200 for use in a high voltage tolerant application, in accordance with an embodiment of the present invention. IO interface circuit 200 includes an IO pad 202, or an alternative signal pad, and at least a first bipolar transistor 204 including an emitter (E) connecting to a first supply voltage source of the interface circuit, which may be a voltage return of the interface circuit (e.g., ground or VSS), a base (B) adapted to receive a first control signal, Vc, and a collector (C) connected directly to the IO pad in an open collector configuration. The term "open-collector" typically refers to a transistor output arrangement where the collector, or other output terminal (e.g., drain), of the transistor is not connected to a positive voltage source but is left open at the IO pad of an IC. An advantage of this arrangement is that the open collector output can be connected to a wide range of voltages (e.g., a voltage greater than a saturation voltage of the output transistor device) using, for example, a pull-up resistor or alternative pull-up circuit (e.g., active device). In this manner, the open collector output is capable of interfacing with various voltage levels, some of which may even be higher than a second supply voltage source of the interface circuit 200, which may be VDD.

As apparent from the figure, bipolar transistor 204 is preferably a parasitic NPN transistor (e.g., a lateral or vertical NPN). Where relatively low speed (e.g., less than about 100 megahertz (MHz)) is acceptable, parasitic bipolar devices offer much higher voltage tolerance without worry of the oxide breakdown phenomena characteristic of MOS devices. Moreover, parasitic bipolar devices are available in standard CMOS processes at little or no additional cost. Techniques for implementing a bipolar device using a CMOS fabrication process are known by those skilled in the art.

Interface circuit 200 further comprises a MOS control circuit 206 coupled to the parasitic NPN transistor 204 and being operative to generate the first control signal Vc. Control circuit 206 may include, for example, a p-channel MOS (PMOS) transistor device, MP, and an NMOS transistor device, MN, connected as an inverter. More particularly, a source (S) of PMOS device MP connects to a supply voltage of interface circuit 200, which may be VDD, a drain (D) of device MP is connected to a drain of NMOS device MN at node N1, a source of device MN connects to the first supply voltage source of the interface circuit (e.g., ground), and gates (G) of devices MP and MN are connected together and form an input of the control circuit at node N2 for receiving an input signal, Vin, supplied to the interface circuit. Control signal Vc will therefore be generated as a function of input signal Vin. It is to be understood that various alternative configurations for control circuit 206 are similarly contemplated and are within the scope of the present invention. It is to be appreciated that one or more of the voltage supply connections, namely, VDD and/or ground, to control circuit 206 need not be the same as the voltage supply connection to the parasitic bipolar device. In this manner, the parasitic bipolar transistor 204 can be electrically isolated from the MOS control circuit 206 coupled thereto.

Figure 3:
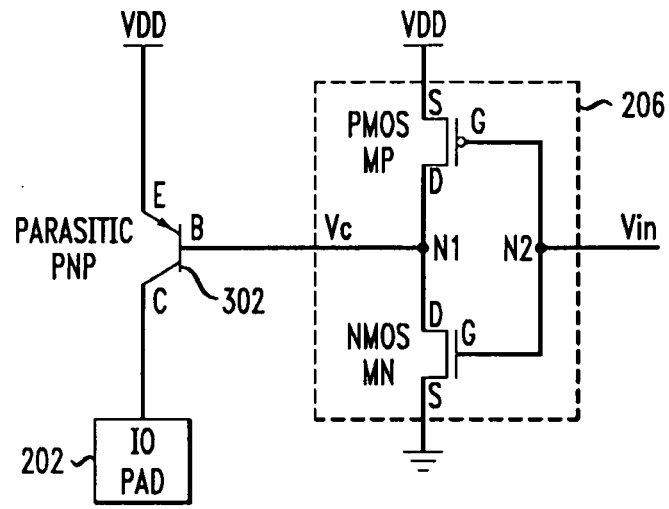
FIG. 3 is a schematic diagram depicting at least a portion of an exemplary IO interface circuit for use in a high voltage tolerant application, in accordance with another embodiment of the present invention.

In an alternative embodiment, shown in FIG. 3, rather being connected between the IO pad 202 and the first supply voltage source (e.g., ground), an exemplary IO interface circuit 300 may employ a bipolar transistor 302 connected directly between the second supply voltage source (e.g., VDD) and the IO pad. Like reference numerals are used to designate the same elements throughout the figures. In this configuration, bipolar transistor 302 may comprise a parasitic PNP transistor (e.g., a lateral or vertical PNP) having an emitter connected to VDD, a collector connected directly to IO pad 202, and a base adapted to receive control signal Vc. This open collector output stage configuration may be utilized, for example, in a pull-up application. In this instance, an external resistor (not shown) may be connected to the IO pad 202 in order to set the output of the interface circuit 300 to a logic low level when the parasitic bipolar transistor 302 is turned off.

Figure 4:
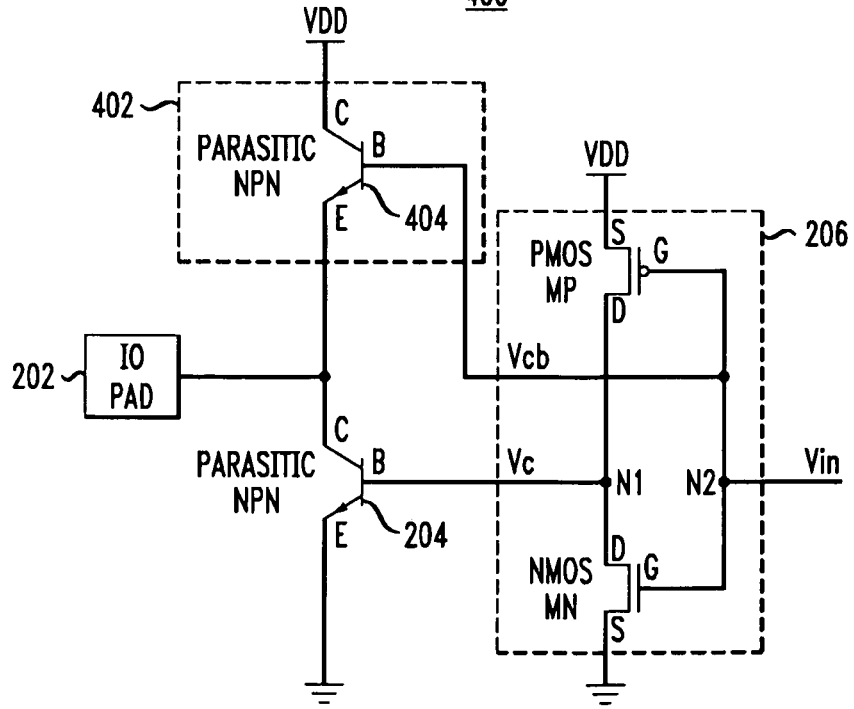
FIG. 4 is a schematic diagram depicting at least a portion of an exemplary active pull-up IO interface circuit for use in a high voltage tolerant application, in accordance with an embodiment of the present invention.

FIG. 4 is a schematic diagram depicting at least a portion of an exemplary IO interface circuit 400 for use in a high voltage tolerant application, in accordance with another embodiment of the present invention. Again, like reference numerals are used to designate the same elements throughout the figures. As in the illustrative IO interface circuit 200 shown in FIG. 2, IO interface circuit 400 beneficially utilizes at least a first bipolar transistor 204 connected directly to IO pad 202 in place of a stacked MOS device arrangement (see, e.g., FIG. 1). More particularly, first bipolar transistor 204 includes an emitter connecting to a first supply voltage source of interface circuit 400, which may be ground, a base adapted to receive a first control signal, Vc, and a collector connected directly to IO pad 202. However, rather than being configured in an open collector arrangement, as shown in FIGS. 2 and 3, IO interface circuit 400 includes an active pull-up circuit 402 connected between second supply voltage source VDD and IO pad 202. Control signal Vc may be generated by control circuit 206 coupled to the first bipolar transistor 204.

In order to protect pull-up circuit 402 from overvoltage stress, the pull-up circuit includes at least a second bipolar transistor 404. As apparent from the figure, bipolar transistor 404 is preferably implemented as a parasitic NPN transistor which, as previously stated, offers substantially higher voltage tolerance without worry of oxide breakdown characteristic of MOS devices. Specifically, a collector of bipolar transistor 404 connects to the second supply voltage source VDD, an emitter of bipolar transistor 404 is directly connected to IO pad 202, and a base of bipolar transistor 404 is adapted for receiving a second control signal, Vcb. Second control signal Vcb, which may be generated by control circuit 206, is preferably a logical complement of first control signal Vc.

Figure 5:
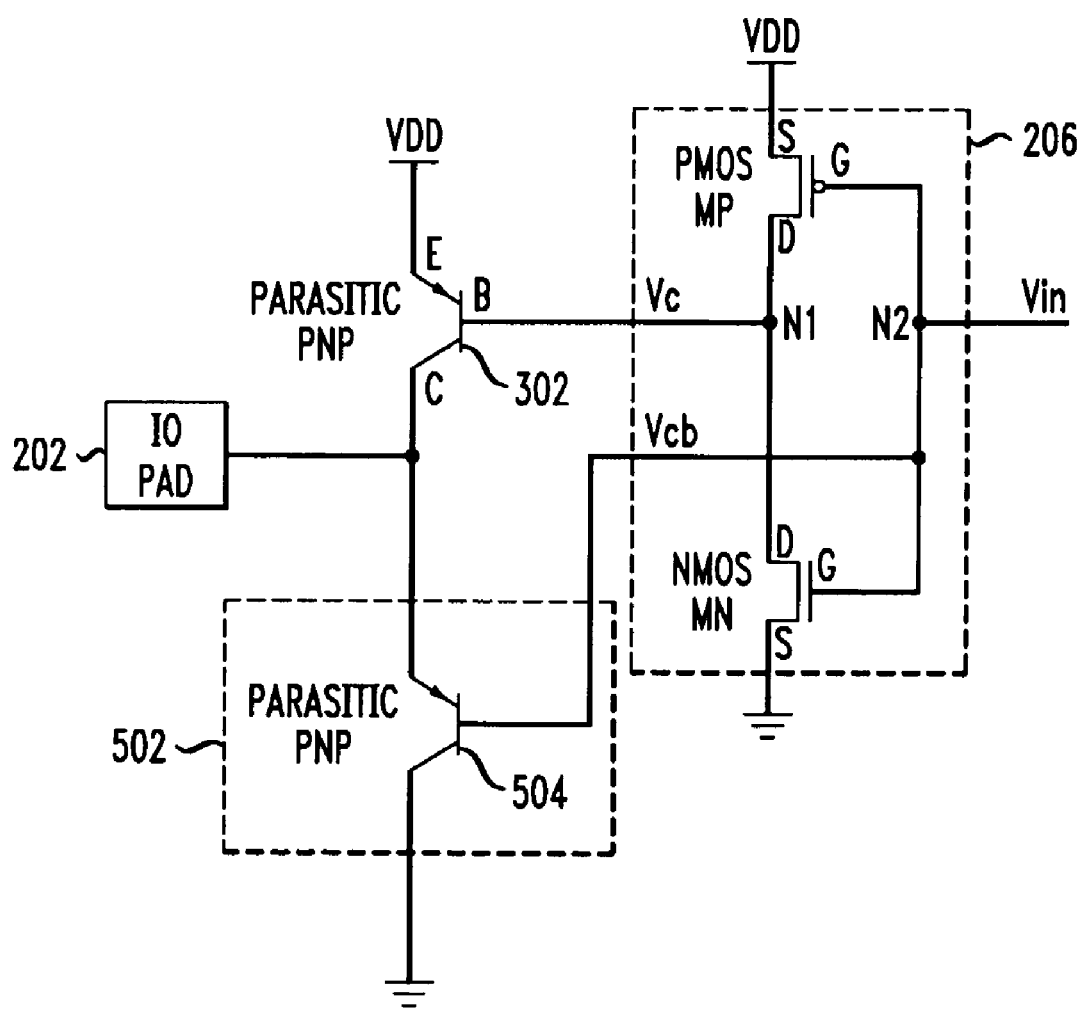
FIG. 5 is a schematic diagram depicting at least a portion of an exemplary active pull-up IO interface circuit for use in a high voltage tolerant application, in accordance with another embodiment of the present invention.

In other embodiments, an example of which is shown in FIG. 5, an illustrative IO interface circuit 500 may include an active pull-down circuit 502 comprising a parasitic PNP transistor 504 having a collector connecting to the second supply voltage source, an emitter connected directly to IO pad 202, and a base adapted for receiving the second control signal Vcb which is a logical complement of first control signal Vc. It is to be appreciated that various alternative configurations are contemplated for the IO interface circuit in accordance with the teachings of the present invention.

At least a portion of the techniques of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in any application and/or electronic system which utilize an IO interface circuit. Suitable systems for implementing the invention may include, but are not limited to, personal computers, communication networks, electronic instruments (e.g., automated test equipment (ATE)), interface networks, display systems, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An input/output (IO) interface circuit, comprising:
   a signal pad;
   at least a first parasitic bipolar transistor including an emitter adapted for connection to a first voltage source, a base adapted to receive a first control signal, and a collector connected directly to the signal pad in an open collector configuration; and
   a metal-oxide-semiconductor (MOS) control circuit coupled to the at least a first parasitic bipolar transistor and being operative to generate the first control signal.

2. The interface circuit of claim 1, wherein the at least a first parasitic bipolar transistor comprises at least one of a parasitic NPN transistor and a parasitic PNP transistor.

3. The interface circuit of claim 1, wherein the first voltage source is a voltage return of the interface circuit and the at least a first parasitic bipolar transistor comprises a parasitic NPN transistor.

4. The interface circuit of claim 1, wherein the first voltage source is a voltage supply of the interface circuit and the at least a first parasitic bipolar transistor comprises a parasitic PNP transistor.

5. The interface circuit of claim 1, wherein the at least a first parasitic bipolar transistor comprises at least one of a lateral bipolar transistor and a vertical bipolar transistor.

6. The interface circuit of claim 1, wherein the control circuit comprises at least one inverter including a p-channel metal-oxide-semiconductor (PMOS) device and an re-channel metal-oxide-semiconductor (NMOS) device, a first source/drain of the PMOS device connecting to a voltage supply of the interface circuit, a second source/drain of the PMOS device connected to a first source/drain of the NMOS device and forming an output of the control circuit for generating the first control signal, a second source/drain of the NMOS device connecting to the first voltage source, and gates of the PMOS and NMOS devices connected together and being adapted for receiving an input signal to the control circuit.

7. The interface circuit of claim 1, wherein the at least first parasitic bipolar transistor is operative to provide a high-voltage signal tolerance to the I/O interface circuit.

8. The interface circuit of claim 1, wherein the collector of the at least first parasitic bipolar transistor is electrically isolated from voltage supply connections within the interface circuit.

9. The interface circuit of claim 1, wherein an input signal to the control circuit causes an output of the control circuit to switch between being connected to the first voltage source and being connected to a voltage supply of the interface circuit.

10. The interface circuit of claim 1, wherein a signal provided by the collector of the at least first parasitic bipolar transistor remains substantially constant when an input signal to the control circuit remains substantially constant.

11. An IO interface circuit, comprising:
    a signal pad;
    at least a first parasitic bipolar transistor including an emitter adapted for connection to a first voltage source, a base adapted to receive a first control signal, and a collector connected directly to the signal pad;
    an active pull-up circuit connected between a second voltage source and the signal pad, the active pull-up circuit being adapted to receive a second control signal, the second control signal being a logical complement of the first control signal; and
    a MOS control circuit coupled to the first parasitic bipolar transistor and being operative to generate the first and second control signals.

12. The interface circuit of claim 11, wherein the active pull-up circuit comprises at least a second parasitic bipolar transistor including an emitter connected to the signal pad, a collector adapted for connection to the second voltage source, and a base adapted for receiving the second control signal.

13. The interface circuit of claim 12, wherein each of the at least first and second parasitic bipolar transistors comprises a parasitic PNP transistor.

14. The interface circuit of claim 11, wherein the control circuit comprises at least one inverter including a p-channel metal-oxide-semiconductor (PMOS) device and an n-channel metal-oxide-semiconductor (NMOS) device, a first source/drain of the PMOS device connecting to the second voltage source, a second source/drain of the PMOS device connected to a first source/drain of the NMOS device and forming an output of the control circuit for generating the first control signal, a second source/drain of the NMOS device connecting to the first voltage source, and gates of the PMOS and NMOS devices connected together and being adapted for receiving an input signal to the control circuit.

15. The interface circuit of claim 11, wherein at least one of the first and second voltage sources is electrically isolated from voltage supply connections to the MOS control circuit.

16. An integrated circuit comprising at least one IO interface circuit according to claim 11.

17. The interface circuit of claim 11, wherein the first voltage source is a voltage supply of the interface circuit and the second voltage source is a voltage return of the interface circuit.

18. An integrated circuit including at least one input/output (JO) interface circuit, the at least one IO interface circuit comprising:
    a signal pad;
    at least a first parasitic bipolar transistor including an emitter adapted for connection to a first voltage source, a base adapted to receive a first control signal, and a collector connected directly to the signal pad in an open collector configuration; and a metal-oxide-semiconductor (MOS) control circuit coupled to the at least a first parasitic bipolar transistor and being operative to generate the first control signal.

19. The integrated circuit of claim 18, wherein the first parasitic bipolar transistor comprises at least one of a parasitic NPN transistor and a parasitic PNP transistor.

20. The integrated circuit of claim 18, wherein the first voltage source is a voltage return of the at least one interface circuit and the at least a first parasitic bipolar transistor comprises a parasitic NPN transistor.

21. The integrated circuit of claim 18, wherein the first voltage source is a voltage supply of the at least one interface circuit and the at least a first parasitic bipolar transistor comprises a parasitic PNP transistor.

22. The integrated circuit of claim 18, wherein the at least a first parasitic bipolar transistor comprises at least one of a lateral bipolar transistor and a vertical bipolar transistor.

23. The integrated circuit of claim 18, wherein the control circuit comprises at least one inverter including a p-channel metal-oxide-semiconductor (PMOS) device and an re-channel metal-oxide-semiconductor (NMOS) device, a first source/drain of the PMOS device connecting to a voltage supply of the interface circuit, a second source/drain of the PMOS device connected to a first source/drain of the NMOS device and forming an output of the control circuit for generating the first control signal, a second source/drain of the NMOS device connecting to the first voltage source, and gates of the PMOS and NMOS devices connected together and being adapted for receiving an input signal to the control circuit.

24. A method for increasing a voltage tolerance of an IO interface circuit, the method comprising the steps of:
providing at least a first parasitic bipolar transistor having an emitter adapted for connection to a first voltage supply, a base adapted to receive a first control signal, and a collector connected directly to a signal pad of the IO interface circuit in an open collector configuration; and
generating the first control signal as a function of an input signal applied to the IO interface circuit.

25. The method of claim 24 wherein the step of providing at least a first parasitic bipolar transistor comprises forming the first parasitic bipolar transistor with the remainder of the IO interface circuit using a standard CMOS process.

* * * * *

UNITED STATES PATENT AND TRADEMARK OFFICE
CERTIFICATE OF CORRECTION

| | | |
|---|---|---|
| PATENT NO. | : 8,310,275 B2 | Page 1 of 1 |
| APPLICATION NO. | : 12/439389 | |
| DATED | : November 13, 2012 | |
| INVENTOR(S) | : Edward B. Harris and Che Choi Leung | |

It is certified that error appears in the above-identified patent and that said Letters Patent is hereby corrected as shown below:

In the claims:

Claim 6, col. 5, line 54, please delete "re-chan" and insert --n-chan-

Claim 18, col. 6, line 60, please delete "(JO)" and insert --(IO)--

Claim 23, col. 7, line 21, please delete "re-chan" and insert --n-chan--

Signed and Sealed this
First Day of January, 2013

David J. Kappos
*Director of the United States Patent and Trademark Office*